United States Patent
Ueno

[19]

[11] Patent Number: 6,159,625
[45] Date of Patent: Dec. 12, 2000

[54] TARGET OF INTERMETALLIC COMPOUND WITH B2-ORDERED LATTICE STRUCTURE, PRODUCTION METHOD THEREOF AND MAGNETIC RECORDING MEDIUM HAVING B2-STRUCTURED UNDERLAYER

[75] Inventor: Tomonori Ueno, Shimane-ken, Japan

[73] Assignee: Hitachi Metals Ltd., Tokyo, Japan

[21] Appl. No.: 09/130,167

[22] Filed: Aug. 6, 1998

[30] Foreign Application Priority Data

Aug. 8, 1997 [JP] Japan .................................. 9-227331
Apr. 14, 1998 [JP] Japan ................................. 10-120038

[51] Int. Cl.[7] ...................................................... G11B 5/66
[52] U.S. Cl. .............................. 428/694 T; 428/694 TS; 428/900; 204/192.2; 204/298.12; 204/298.13
[58] Field of Search ........................ 428/694 T, 694 TS, 428/900; 204/192.2, 298.12, 298.13

[56] References Cited

U.S. PATENT DOCUMENTS

| | | | |
|---|---|---|---|
| 5,693,426 | 12/1997 | Lee et al. ................................. | 428/611 |
| 5,863,398 | 1/1999 | Kardokus ........................... | 204/298.13 |
| 5,882,493 | 3/1999 | Iwasaki .............................. | 204/298.13 |
| 5,896,553 | 4/1999 | Lo ............................................. | 419/23 |
| 5,997,704 | 12/1999 | Shiouo ................................ | 204/298.12 |

FOREIGN PATENT DOCUMENTS

0704839 A1  4/1996  European Pat. Off. .

OTHER PUBLICATIONS

IEEE Transactions on Magnetics, vol. 30, No. 6, Nov. 1994, pp. 3951–3953, "NiAl Underlayers For CoCrTa Magnetic Thin Films", Li–Lien Lee et al.

IEEE Transactions on Magnetics, vol. 31, No. 6, Nov. 1995, pp. 2728–2730, "Effects of Cr Intermediate Layers on CoCrPt Thin Film Media on NiAl Underlayers", Li–Lien Lee et al.

Lee, et al. "NiAl Underlayers . . . " IEEE Transactions on Magnetics, vol. 30, No. 6, Nov. 1994.

*Primary Examiner*—Leszek Kiliman
*Attorney, Agent, or Firm*—Sughrue, Mion, Zinn, Macpeak & Seas, PLLC

[57] ABSTRACT

A target for sputter-depositing a B2-structured thin film for an underlayer of a magnetic recording medium. Since the target is made of a sintered body of an intermetallic compound being substantially a B2-ordered lattice structure, the target has a uniform small grain size and a high bending strength. The target produces a thin film with a small grain size and a minimized particle deposition.

20 Claims, 1 Drawing Sheet

TARGET OF INTERMETALLIC COMPOUND WITH B2-ORDERED LATTICE STRUCTURE, PRODUCTION METHOD THEREOF AND MAGNETIC RECORDING MEDIUM HAVING B2-STRUCTURED UNDERLAYER

BACKGROUND OF THE INVENTION

The present invention relates to a sintered target for depositing an underlayer of magnetic recording media for use in a magnetic disk drive, etc., which comprises a sintered body of a intermetallic compound with a B2-ordered lattice structure, a production method of the sintered target, and a magnetic recording medium with a B2-structured underlayer formed by sputtering the sintered target.

Many improvements have been made on a Co-based magnetic layer of magnetic recording media to achieve a high density magnetic recording. For example, an underlayer is disposed under the magnetic layer to allow the magnetic layer to grow epitaxially on the underlayer. To ensure a good epitaxial growth of the magnetic layer, several considerations and improvements have been made on the underlayer with respect to the lattice constant, the crystalline orientation, the grain size and the uniformity of the film structure. As the material for the underlayer, pure Cr and Cr alloy have been widely used in the art because of a good lattice match between the Co-based magnetic layer and the Cr-based underlayer.

As an underlayer having a lattice constant identical to that of a Cr-based film, a thin film of an intermetallic compound with a B2-ordered lattice structure has been proposed in EP 0704839 A1, U.S. Pat. No. 5,693,426, IEEE Trans. Magn., vol. 30, 3951 (1994), IEEE Trans. Magn., vol. 31, 2728 (1995), etc.

The B2-ordered lattice structure may be referred to as CsCl structure, and includes lattice positions (0, 0, 0) and (½, ½, ½). In an NiAl intermetallic compound having a typical B2-ordered lattice structure, when the atomic ratio, Ni/Al, is 1, Ni atoms occupy the positions (0, 0, 0) and Al atoms occupy the positions (½, ½, ½). When Ni/Al>1, Ni atoms occupy the positions (0, 0, 0) and Ni atoms and Al atoms occupy the positions (½, ½, ½). When Ni/Al<1, Ni atoms and voids occupy the positions (0, 0, 0) and Al atoms occupy the positions (½, ½, ½). The lattice constant of NiAl is 0.2887 nm when Ni/Al=1, almost identical to that of pure Cr 0.2884 nm.

The above documents propose to deposit a thin film of the intermetallic compound with the B2-ordered lattice structure, in place of a Cr underlayer, as the underlayer on which the magnetic layer is directly deposited, and alternatively to deposit a thin film of the intermetallic compound with the B2-ordered lattice structure under a pure Cr intermediate layer. It is reported in the documents that the B2-structured layer under the Cr intermediate layer reduces the grain size of the Cr intermediate layer and provides a magnetic recording medium with increased coercive force.

As a result of studies on the underlayer having the B2-ordered structure, the inventor has confirmed that the underlayer of the intermetallic compound with the B2-ordered lattice structure has a lattice constant close to that of the Co-based magnetic layer, and also has a crystalline orientation and a fine, uniform structure suitable as the underlayer of Co-based magnetic recording media.

The underlayer of the intermetallic compound with the B2-ordered lattice structure may be usually deposited by RF-sputtering a target as described in the above documents. However, the documents teach nothing about the detail of the target for forming the B2-structured thin film.

The inventor has attempted to produce a target for depositing a uniform film of the B2-ordered lattice intermetallic compound by a melting/casting method. However, the resultant cast target was too poor in bending strength and easily broken during the machining process and sputtering process. Further, relatively small chill crystals, coarse columnar crystals extending along the cooling direction and relatively small equiaxed crystals were formed in the cast target, and there was a larger variation in the grain size as shown in FIG. 3. The large variation in the grain size of the cast target causes the particle deposition and the nonuniform thickness of the thin film being deposited. If the thickness of the underlayer is uneven, a thin film to be deposited thereon becomes difficult to epitaxially grow, and as a result thereof, the characteristics of magnetic recording media are deteriorated.

OBJECT AND SUMMARY OF THE INVENTION

Accordingly, an object of the present invention is to provide a target of a B2-ordered lattice intermetallic compound having a high bending strength and a uniform small grain size.

Another object of the present invention is to provide a target of a B2-ordered lattice intermetallic compound capable of forming a deposited thin film with a uniform structure and a reduced number of particle depositions.

Still another object of the present invention is to provide a method of producing the above target.

Still another object of the present invention is to provide a magnetic recording medium with a thin film of the B2-ordered lattice intermetallic compound formed by sputtering the above target.

As a result of intense research in view of the above objects, the inventor has found that the bending strength of the target of the B2-ordered lattice intermetallic compound is largely depends on the microstructure thereof. The inventor has also found that the large variation in the grain size occurred in the cast target is not found in a target produced by sintering a powder of the B2-ordered lattice intermetallic compound. Further, the inventor has found that such a sintered target has a high bending strength. The present invention has been accomplished based on these findings.

Thus, in a first aspect of the present invention, there is provided a target comprising a sintered body of an intermetallic compound being substantially B2-ordered lattice structure.

In a second aspect of the present invention, there is provided a method of producing the above target, which comprises the steps of (1) preparing a powder mixture by mixing a powder of a first B2 phase-forming element and a powder of a second B2 phase-forming element; (2) reaction-sintering the powder mixture to form the intermetallic compound being substantially B2-ordered lattice structure; and (3) pressure-sintering a powder of the intermetallic compound being substantially B2-ordered lattice structure.

In a third aspect of the present invention, there is provided a magnetic recording medium comprising a Co-based magnetic layer, a non-magnetic substrate and multiple underlayers between the magnetic layer and the substrate, at least one layer of the multiple underlayers being a substantially B2-structured thin film deposited by sputtering the target as defined above.

DETAILED DESCRIPTION OF THE INVENTION

Figure 1:
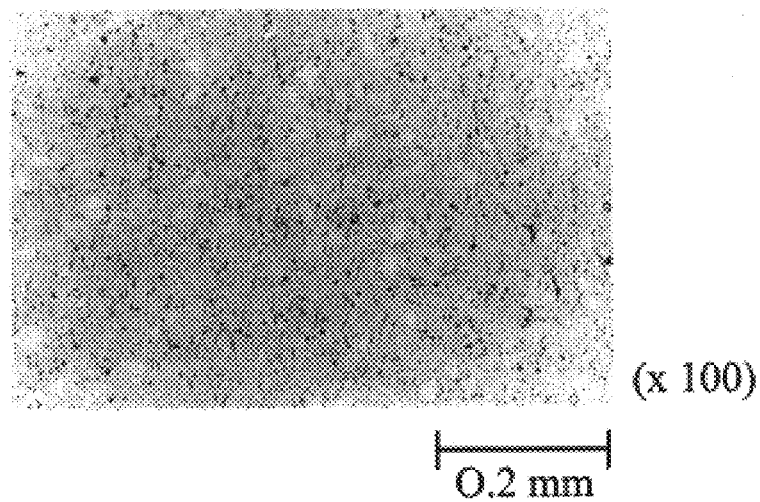
FIG. 1 is a photomicrograph of the target No. 1 showing a typical microstructure of the target according to the present invention.

The present invention will be described below more in detail.

(1) Target

The target of the present invention comprises a sintered body of an intermetallic compound being substantially B2-ordered lattice structure. The sintered body is preferably obtained by sintering a powder of the intermetallic compound being substantially B2-ordered lattice structure.

One of the characteristic features of the present invention is to produce the target by a sintering method. The use of the sintering method can avoid the decrease in the bending strength caused by the increased grain size, which is a problem encountered in producing the target by the melting/casting method.

The intermetallic compound constituting the sintered target is substantially the B2-ordered lattice structure. Such an intermetallic compound comprises, as the basic components, a combination of two B2 phase-forming elements. For example, the combination usable in the present invention is Ru—Al, Mn—Rh, Co—Al, Co—Zr, Fe—Al, Ir—Al, Os—Al or Ni—Al. An Ni—Al based intermetallic compound is most preferable because the B2-ordered lattice structure of Ni—Al creates a good lattice match with the Cr-based layer. The atomic ratio between two B2 phase-forming elements is basically about 50:50 to obtain the substantially B2-ordered lattice structure. In the Ni—Al based intermetallic compound, the substantially B2-ordered lattice structure may be attained by 42–69 atomic % Ni and 31–58 atomic % Al.

The B2-ordered lattice structure of an underlayer makes the underlayer well lattice-matching with a Co-based magnetic layer or a Cr-based intermediate layer. In the recent technique, an additive element such as Cr, Ta, Pt, Ni, etc. is added to the Co-based magnetic layer, and an additive element such as V, Ti, etc. is added to the Cr-based intermediate layer or underlayer. Since the addition of such additive elements enlarges the lattice constant of the Co-based or Cr-based thin film, it is preferred to add an additive element to the intermetallic compound to enlarge the lattice constant of the intermetallic compound thereby to ensure a good match between the enlarged lattices.

For example, a B2-ordered lattice constituted by only Ni and Al fails in some cases to match the enlarged lattice of the Co-based or Cr-based layer. Therefore, an additive element may be used together with Ni and Al to enlarge the lattice constant of the B2-ordered lattice thereby to ensure a good match with the enlarged lattice of the Co-based or Cr-based layer. Such an additive element may be Mn, Ru, Rh, Pd, Re, Os, Ir and Pt, which are capable of producing together with Al an intermetallic compound with a B2-ordered lattice having a lattice constant larger than that of the B2-ordered lattice made of only Ni and Al. Also usable as the additive element is an element, such as Ti, Zr, Nb, Hf and Ta, which does not produce the B2-ordered lattice but has an atomic radius larger than that of Al and is capable of being dissolved into the Ni—Al based intermetallic compound with the B2-ordered lattice structure. An element such as B capable of enlarging the lattice constant by entering into the lattice may be also used as the additive element. The addition amount of the additive element should be regulated within a range of not destroying the B2-ordered lattice structure, and preferably 5 atomic % or less.

Rare earth elements may be used together with the basic elements constituting the B2-ordered lattice in an amount substantially not affecting the B2-ordered lattice structure. Although a large amount of rare earth elements detrimentally affects the B2-ordered lattice structure, the addition of a small amount is effective for reducing the grain size of the thin film being deposited.

The relative density of the sintered target is preferably 99% or more. By regulating the relative density within the above range, the decrease in the bending strength which depends on the density can be avoided. The average grain size of the sintered target is preferably 200 μm or less, and more preferably 30 μm or less. An average grain size of less than 1 μm is practically difficult to obtain. When the average grain size is as small as 200 μm or less, the difference in the sputtering speeds depending on the crystallographic orientations of the grains can be minimized and a thin film with uniform structure can be effectively obtained. Also, since fine grains create a large amount of grain boundaries absorbing minute strain due to the thermal stress during the sputtering process, the bending strength of the target is enhanced to 250 MPa or more which has not been attained in conventional cast targets. The sintered target of the present invention has a relatively small, uniform grain size as compared with the target produced by the melting/casting method.

A gas element such as oxygen, etc. may be contained in the sintered target in an amount substantially not affecting the B2-ordered lattice structure. Although a large amount of oxygen, in particular, detrimentally affects the B2-ordered lattice structure, the addition of a small amount is effective for reducing the grain size of the thin film being deposited. The oxygen content in the target is preferably 6000 ppm or less, more preferably 50–5000 ppm, particularly preferably 200–5000 ppm and still particularly preferably 1000–4000 ppm. The oxygen content larger than 6000 ppm is unfavorable because the amount of oxides in the target is increased to cause the abnormal discharge during the sputtering process and the particle deposition in the thin film being deposited. In addition, the oxygen content larger than 6000 ppm increases the amount of the second phase other than the B2-ordered phase in the thin film being deposited to make the lattice mismatch between the deposited film and a thin film being deposited thereon too large, thereby to deteriorate the magnetic properties of the magnetic recording media.

Further, from the knowledge of the inventor, as compared with a thin film formed by a target containing 100 ppm or less oxygen, a thin film formed by a target containing relatively large amount of oxygen is preferentially oriented to (100) plane, which promotes the epitaxial growth thereon. Therefore, the oxygen content is preferred to be large within the above range in view of enhancing the magnetic characteristic of the magnetic recording media. However, in some cases, a low oxygen content is required because oxygen occasionally enters into the magnetic layer to deteriorate the magnetic properties such as squareness ratio.

(2) Method of Producing Target

The target of the present invention is produced by sintering a powder of the intermetallic compound having the B2-ordered lattice structure. The sintering powder of the intermetallic compound may be obtained by pulverizing or atomizing an ingot produced by a melting method. The powder obtained by the atomize method may be further pulverized to obtain the sintering powder. The atomize method with or without the subsequent pulverization is effective in decreasing the oxygen content, and therefore, a target with a low oxygen content of 50–1000 ppm is preferred to be produced from a sintering powder prepared by the atomize method with or without the subsequent pulverization. However, the above method of preparing the sintering powder requires to prevent the target material from reacting with the furnace material by employing a skull melting method, thereby increasing the production cost, although it is effective for preparing a sintering powder for a target with a low oxygen content.

Therefore, when a target with a relatively high oxygen content is required, the sintering powder is preferably prepared, without employing the melting process, by a method comprising the steps of mechanically mixing powders of the first and second B2 phase-forming elements selected from Ru, Al, Mn, Rh, Co, Zr, Fe, Ir, Os and Ni, reaction-sintering the powder mixture to form the intermetallic compound having the B2-ordered lattice structure, and pulverizing the sintered product. The reaction sintering is advantageously promoted by self-heating during the reaction between the first and second B2 phase-forming elements. The reaction-sintered product of the intermetallic compound is pulverized to have an average particle size of 10 to 200 µm thereby to prepare a sintering powder.

The sintering powder thus prepared is then sintered by a hot isostatic press (HIP) method under the conditions of a sintering temperature of 1000 to 1300° C., a sintering pressure of 80 to 150 MPa, and a sintering time of 2 to 5 hours. The sintered product is then machined, if desired, to obtain the sintered target of the present invention, for example, in a shape of disk with a size of about 100 mm in diameter and about 4 mm in thickness.

A powder of the optional additive elements mentioned above may be added to the powder mixture for forming the intermetallic compound before the reaction sintering, or added to the sintering powder after the reaction sintering.

(3) Magnetic Recording Media

The sintered target of the present invention is suitably used for sputter-depositing a thin film forming at least one layer of multiple underlayers between a Co-based magnetic layer and a non-magnetic substrate of a magnetic recording medium. The thin film has a reduced number of particle deposition, a small grain size and a minimized variation in film thickness.

The thin film of the intermetallic compound having the B2-ordered lattice structure is used as an underlayer for forming thereon a magnetic layer with a small grain size and fine, uniform structure, and therefore, it is suitably applied to a magnetic recording medium requiring a higher recording density rather than to a magnetic recording medium requiring a recording density of not so high. For example, the target of the present invention is particularly suitable for producing a small-sized, large storage capacity hard disk used in note-type personal computers. Specifically, the sintered target of the present invention is preferable to form an underlayer of a magnetic recording medium comprising a Co-based magnetic layer for forming a magnetic recording layer, a Cr-based underlayer under and in contact with the Co-based magnetic layer, a B2-structured underlayer under and in contact with the Cr-based underlayer and a glass substrate.

The Co-based magnetic layer is preferably contains additive elements such as Cr, Pt, Pd, Ni, Ti, V, Ta, W and B in a total amount of 15 atomic % or more to attain a high recording density.

The Cr-based underlayer is preferably positioned under the Co-based magnetic layer. The Cr-based underlayer has a crystalline structure suitable for the epitaxial growth of the Co-based magnetic layer. Further, Cr in the Cr-based underlayer diffuses into the grain boundaries of the Co-based magnetic layer and isolates neighboring grains to improve the coercive squareness of the magnetic layer. The material for the Cr-based underlayer may be pure Cr which may be added with an element enlarging the lattice constant, such as Ti, V, Mo, etc., according to the amount and type of the additive element in the Co-based magnetic layer. The addition amount depends on the degree of lattice match with the Co-based magnetic layer, and is usually selected from a range of 30 atomic % or less so as to maintain the face centered cubic structure of the Cr-based magnetic layer.

The thin film of the intermetallic compound with the B2-ordered lattice structure is deposited to a thickness employed in the art by sputtering the sintered target by a known sputtering method, for example, DC sputtering method under known conditions. The thin film deposited by sputtering the sintered target of the present invention has a small average grain size and a minimized particle deposition.

Each of the layers other than the B2-structured underlayer in the magnetic recording medium of the present invention is also deposited to a thickness employed in the art by a known sputtering method.

The present invention will be further described while referring to the following Examples which should be considered to illustrate various preferred embodiments of the present invention.

EXAMPLE 1

Powders of respective metals for Sample Nos. 1–8 in Table 1 were mixed, and reaction-sintered to prepare each intermetallic compound with the B2-ordered lattice structure. Each intermetallic compound was pulverized in a ball mill to prepare each sintering powder. The sintering powder was then sintered by HIP under the conditions of 1200° C.×100 MPa×3 hours to obtain each sintered target (Nos. 1–8) in a disk form with a size of 101 mm in diameter and 4 mm in thickness.

Separately, comparative cast targets Nos. 9–16 in the same disk form as above were produced by melting respective powder mixtures shown in Table 1 and precision-casting the melts.

The bending strength, the relative density and the volume average grain size of the targets are shown in Table 1. In FIG. 1, a photomicrographic microstructure of Sample No. 1 is shown as a typical microstructure of the target according to the present invention.

The bending strength was measured according to the tree-point bending test prescribed in JIS Z 2248 (ISO 7438).

The relative density (measured density of target/theoretical density of intermetallic compound) was measured by Archimedes method and the volume average grain size was measured by an intercept method.

TABLE 1

| Sample No. | Composition (atomic %) | Production Method | Bending Strength (MPa) | Relative Density (%) | Average Grain Size (μm) | Oxygen (ppm) |
|---|---|---|---|---|---|---|
| Invention | | | | | | |
| 1 | 50Ru-50Al | Sintering | 450 | 99.3 | 24 | 2500 |
| 2 | 50Mn-50Rh | Sintering | 460 | 99.4 | 25 | 2400 |
| 3 | 50Co-50Al | Sintering | 450 | 99.2 | 20 | 2500 |
| 4 | 50Co-50Zr | Sintering | 400 | 99.6 | 18 | 3100 |
| 5 | 50Fe-50Al | Sintering | 430 | 99.3 | 24 | 2800 |
| 6 | 50Ir-50Al | Sintering | 480 | 99.4 | 23 | 2300 |
| 7 | 50Os-50Al | Sintering | 390 | 99.1 | 45 | 2600 |
| 8 | 50Ni-50Al | Sintering | 450 | 99.3 | 24 | 2600 |
| Comparison | | | | | | |
| 9 | 50Ru-50Al | Melting/Casting | 170 | 99.4 | 750 | 60 |
| 10 | 50Mn-50Rh | Melting/Casting | 100 | 99.5 | 1060 | 60 |
| 11 | 50Co-50Al | Melting/Casting | 130 | 99.3 | 870 | 80 |
| 12 | 50Co-50Zr | Melting/Casting | 120 | 99.4 | 690 | 130 |
| 13 | 50Fe-50Al | Melting/Casting | 160 | 99.6 | 1100 | 100 |
| 14 | 50Ir-50Al | Melting/Casting | 160 | 99.5 | 910 | 140 |
| 15 | 50Os-50Al | Melting/Casting | 180 | 99.2 | 860 | 80 |
| 16 | 50Ni-50Al | Melting/Casting | 100 | 99.5 | 1000 | 100 |

As seen from Table 1 and FIG. 1, according to the present invention, a target having a high density, a small grain size and a high bending strength was obtained by sintering a powder of the intermetallic compound with the B2-ordered lattice structure.

Next, each thin film was deposited on a slide glass by DC-sputtering each of the targets Nos. 1–16 under the conditions of Ar pressure of 0.66 Pa and DC power of 500 W. The number of particle depositions having a size of 2 μm or more on the deposited thin film was counted. The results are shown in Table 2, in which the number of particle depositions are expressed by relative values while assuming that the number for Sample No. 1 is 100.

TABLE 2

| Sample No. | Number of particle depositions of 2 μm or larger |
|---|---|
| Invention | |
| 1 | 100 |
| 2 | 90 |
| 3 | 70 |
| 4 | 110 |
| 5 | 120 |
| 6 | 80 |
| 7 | 100 |
| 8 | 85 |
| Comparison | |
| 9 | 3840 |
| 10 | 4200 |
| 11 | 4120 |
| 12 | 3650 |
| 13 | 3450 |
| 14 | 4150 |
| 15 | 4560 |
| 16 | 3860 |

As seen from Table 2, the number of particle depositions was dramatically reduced in the thin film formed by sputtering the sintered target of the present invention. This advantage is attributable to the small grain size of the target achieved by the sintering method.

EXAMPLE 2

Powders of Ni, Al and optional additive element X were mixed in a composition (atomic %) shown in Table 1 (Sample Nos. 17–23). The powder mixture was reaction-sintered to prepare each intermetallic compound with the B2-ordered lattice structure. The intermetallic compound was pulverized in a ball mill for different period of time to prepare sintering powders having an average particle radius of about 20 μm or 100 μm and having different oxygen contents. Each sintering powder was sintered under the conditions of 1000° C.×100 MPa×3 hours to prepare respective targets Nos. 17–23 in a disk form with a size of 101 mm in diameter and 4 mm in thickness.

Separately, the sintering powder for Sample No. 17, a powder having an average particle radius of about 20 μm prepared by pulverizing in a ball mill an intermetallic compound obtained by reaction-sintering a powder mixture having a composition by atomic % of 40Ni—60Al, and an Nd powder having a particle size of 300 μm or less prepared by an arc melting method or an Ru powder having a particle size of 8 μm in aggregated state prepared by a reduction method were mixed to prepare the sintering powders for Sample Nos. 24 and 25 having respective compositions shown in Table 3. Each sintering powder was sintered under the conditions of 1000° C.×100 MPa×3 hours to prepare respective targets Nos. 24 and 25 in a disk form having a size of 101 mm in diameter and 4 mm in thickness.

Further, a comparative cast target No. 26 with a size of 101 mm in diameter and 4 mm in thickness was prepared by skull-melting a sintering powder having a composition of 50Ni—50Al (atomic %) and precision-casting the melt.

Figure 2:
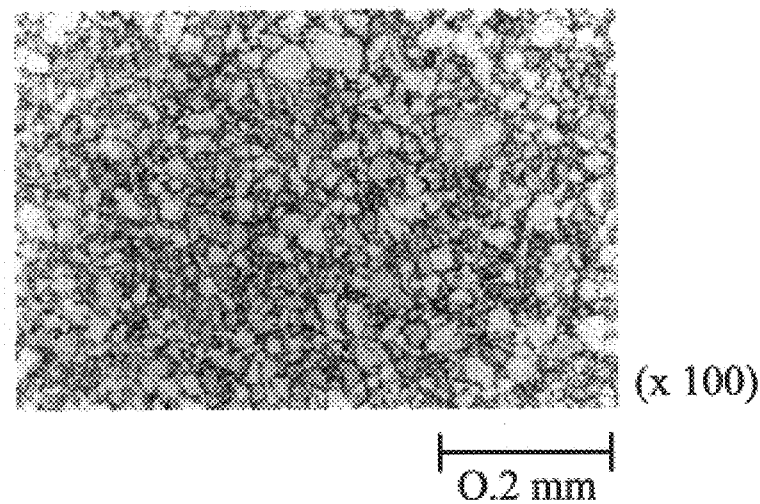
FIG. 2 is a photomicrograph of the target No. 17 showing a typical microstructure of the target according to the present invention.
Figure 3:
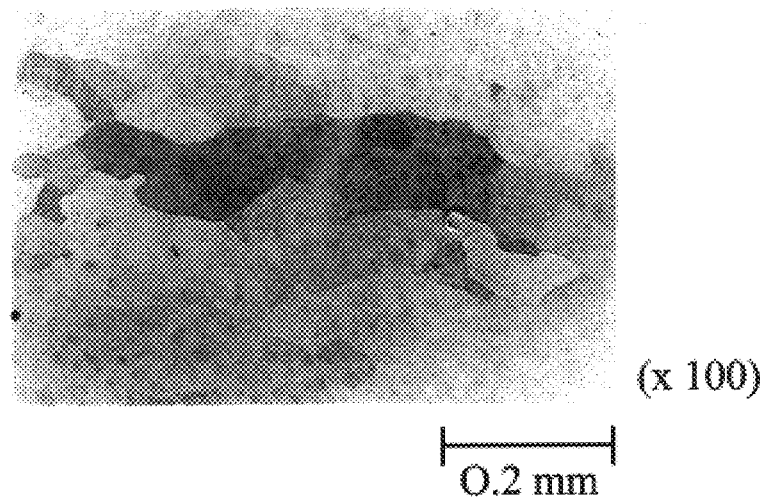
FIG. 3 is a photomicrograph of the target No. 26 showing a typical microstructure of the comparative cast target.

The bending strength, the density and the volume average grain size of each target measured in the same methods as in Example 1 are shown in Table 3. In FIG. 2, a photomicrographic microstructure of Sample No. 17 is shown as a typical microstructure of the target according to the present invention. In FIG. 3, the microstructure of the comparative cast target No. 26 is shown. As seen from FIG. 3, the melting/casting method forms the grains of extremely large size with a large variation in the grain size.

TABLE 3

| Sample No. | Composition (atomic %) | Production Method | Bending Strength (MPa) | Relative Density (%) | Average Grain Size ($\mu$m) | Oxygen (ppm) |
|---|---|---|---|---|---|---|
| Invention | | | | | | |
| 17 | 50Ni-50Al | Sintering | 450 | 99.3 | 24 | 2500 |
| 18 | 50Ni-50Al | Sintering | 300 | 99.2 | 110 | 650 |
| 19 | 45Ni-50Al-5Ru | Sintering | 460 | 99.4 | 25 | 2400 |
| 20 | 45Ni-50Al-5Pt | Sintering | 450 | 99.2 | 20 | 2500 |
| 21 | 49Ni-50Al-1MM* | Sintering | 400 | 99.6 | 18 | 3100 |
| 22 | 50Ni-48Al-2Zr | Sintering | 430 | 99.3 | 24 | 2800 |
| 23 | 50Ni-49.5Al-0.5B | Sintering | 480 | 99.4 | 23 | 2300 |
| 24 | 45Ni-50Al-5Ru | Sintering | 390 | 99.1 | 45 | 2600 |
| 25 | 49.5Ni-49.5Al-1Nd | Sintering | 420 | 99.3 | 80 | 3500 |
| Comparison | | | | | | |
| 26 | 50Ni-50Al | Melting/Casting | 100 | 99.5 | 1000 | 100 |

Note: MM is Misch metal.

As seen from Table 3 and FIG. 2, according to the present invention, the sintered targets having a high density, a small grain size and a high bending strength were obtained by sintering a powder of the intermetallic compound with the B2-ordered lattice structure.

EXAMPLE 3

A thin film was deposited on a slide glass substrate by sputtering each of the targets Nos. 17–26 obtained in Example 2 under the conditions of Ar pressure of 0.66 Pa and DC power of 500 W. From X-ray diffraction spectra on the deposited thin films, relative X-ray intensity ratios, (100) peak/(110) peak, were obtained. The results are shown in Table 4 together with the average grain sizes of the thin films determined from Scherrer equation based on the results of X-ray diffraction.

TABLE 4

| Sample No. | (100)/(110) Relative X-ray Intensity Ratio | Average Grain Size (nm) |
|---|---|---|
| Invention | | |
| 17 | 1.35 | 19 |
| 18 | 1.10 | 19 |
| 19 | 1.33 | 20 |
| 20 | 1.34 | 21 |
| 21 | 1.30 | 16 |
| 22 | 1.34 | 18 |
| 23 | 1.25 | 20 |
| 24 | 1.32 | 20 |
| 25 | 1.31 | 17 |
| Comparison | | |
| 26 | 0.52 | 20 |

As seen from the X-ray intensity ratios in Table 4, Sample No. 17 having a larger oxygen content showed higher (100)-plane orientation as compared with Sample No. 18 and the comparative Sample No. 26 each having a smaller oxygen content. This indicates that the (100)-plane orientation desirable for a good epitaxial growth preferentially occurs when the oxygen content is higher. In addition, the average grain size of the deposited thin film is further reduced by the addition of a rare earth element (Sample No. 21).

The number of particle depositions having a size of 2 $\mu$m or more on the thin films deposited by sputtering the targets Nos. 17 and 18 and the comparative cast target No. 26 were counted. The results are shown in Table 5, in which the number of particle deposition are expressed by relative values while assuming that the number for Sample No. 17 is 100.

TABLE 5

| Sample No. | Number of particle deposition of 2 $\mu$m or larger |
|---|---|
| Invention | |
| 17 | 100 |
| 18 | 380 |
| Comparison | |
| 26 | 4560 |

As seen from Table 5, the number of particle depositions was dramatically reduced in the thin film formed by sputtering the sintered target of the present invention. This advantage is attributable to the small grain size of the target achieved by the sintering method.

EXAMPLE 4

On a glass substrate for 2.5-inch magnetic recording medium, a B2-structured thin film of 100 nm thick was deposited by sputtering each of the targets Nos. 17–25 obtained in Example 2 in a single wafer sputtering system. In the same manner, a 80Cr—20Mo (atomic %) underlayer of 2.5 nm thick and a 77Co—15Cr—5Ta—3Pt (atomic %) of 40 nm thick were successively sputter-deposited on the B2-structured thin film to obtain each magnetic recording medium.

The comparative cast target No. 26 was attempted to sputter. However, due to abnormal discharge during the sputtering, the comparative cast target failed to form a thin film suitable for producing a magnetic recording medium. The coercive force Hc and the coercive squareness S* (Hc'/Hc) of each magnetic recording medium measured by a vibrating sample magnetometer (VSM) are shown Table 6.

TABLE 6

| Sample No. | Hc (Oe) | S* |
|---|---|---|
| 17 | 2450 | 0.85 |
| 18 | 2400 | 0.82 |
| 19 | 2480 | 0.85 |
| 20 | 2440 | 0.84 |
| 21 | 2460 | 0.87 |

TABLE 6-continued

| Sample No. | Hc (Oe) | S* |
|---|---|---|
| 22 | 2430 | 0.85 |
| 23 | 2390 | 0.81 |
| 24 | 2460 | 0.85 |
| 25 | 2460 | 0.88 |

As seen from Table 6, of the magnetic recording media produced by sputtering the targets of the present invention, the magnetic recording media obtained using the target No. 17 having a larger oxygen content and the target No. 21 incorporated with a rare earth element were most suitable because they had much better coercive force Hc and coercive squareness S*.

As described above, in the present invention, a sputtering target for forming a B2-structured thin film is produced by sintering a powder of an intermetallic compound with the B2-ordered lattice structure. Since the target produced by the sintering method has a high bending strength, handling of the target is easy and breakage of the target due to the thermal stress during the sputtering process can be prevented. Further, since the sintered target of the present invention has a small grain size, a B2-structured thin film with a reduced number of particle depositions is obtained, thereby to enhance the magnetic properties of the magnetic recording medium.

What is claimed is:

1. A sintered target comprising a sintered body of an intermetallic compound being substantially B2-ordered lattice structure.

2. The sintered target according to claim 1, wherein said sintered body comprises a powder of said intermetallic compound being substantially B2-ordered lattice structure.

3. The sintered target according to claim 1, wherein said sintered target has a relative density of 99% or more and an average grain size of 200 μm or less.

4. The sintered target according to claim 3, wherein said average grain size is 30 μm or less.

5. The sintered target according to claim 1, wherein said target has a bending strength of 250 MPa or more.

6. The sintered target according to claim 1, wherein said sintered target contains oxygen in an amount of 6000 ppm or less.

7. The sintered target according to claim 1, wherein said intermetallic compound being substantially B2-ordered lattice structure mainly comprises a combination of two B2 phase-forming elements, said combination being selected from the group consisting of Ru—Al, Mn—Rh, Co—Al, Co—Zr, Fe—Al, Ir—Al, Os—Al and Ni—Al.

8. The sintered target according to claim 7, wherein said intermetallic compound is an Ni—Al based intermetallic compound.

9. A sintered target comprising a sintered body of an intermetallic compound being substantially B2-ordered lattice structure, said sintered target containing oxygen in an amount of 6000 ppm or less and having a relative density of 99% or more, an average grain size of 200 μm or less and a bending strength of 250 MPa or more.

10. The sintered target according to claim 9, wherein said intermetallic compound being substantially B2-ordered lattice structure mainly comprises a combination of two B2 phase-forming elements, said combination being selected from the group consisting of Ru—Al, Mn—Rh, Co—Al, Co—Zr, Fe—Al, Ir—Al, Os—Al and Ni—Al.

11. The sintered target according to claim 10, wherein said intermetallic compound is an Ni—Al based intermetallic compound.

12. A method of producing the sintered target of an intermetallic compound being substantially B2-ordered lattice structure, comprising the steps of:

preparing a powder of said intermetallic compound being substantially B2-ordered lattice structure; and pressure-sintering a powder of said intermetallic compound being substantially B2-ordered lattice structure.

13. A magnetic recording medium comprising a Co-based magnetic layer, a non-magnetic substrate and multiple underlayers between said magnetic layer and said substrate, at least one layer of said multiple underlayers being a substantially B2-structured thin film deposited by sputtering said sintered target as defined in claim 1.

14. The magnetic recording medium according to claim 13, wherein said magnetic recording medium comprises a Co-based magnetic layer for forming a magnetic recording layer, a Cr-based underlayer under and in contact with said Co-based magnetic layer, a substantially B2-structured underlayer under and in contact with said Cr-based underlayer and a glass substrate.

15. A method of producing a sintered target of an intermetallic compound being substantially B2-ordered lattice structure according to claim 12, wherein said pressure-sintering is promoted at a temperature of less than 1300° C.

16. A method of producing a sintered target of an intermetallic compound being substantially B2-ordered lattice structure according to claim 12, wherein said pressure-sintering is promoted at a pressure of 80 to 150 MPa.

17. A method of producing a sintered target of an intermetallic compound being substantially B2-ordered lattice structure according to claim 12, wherein said pressure-sintering is promoted at a time within 5 hours.

18. A method of producing a sintered target of an intermetallic compound being substantially B2-ordered lattice structure according to claim 12, wherein the powder of said intermetallic compound being substantially B2-ordered lattice structure can be obtained by reaction-sintering the powder mixture of the first and second B2 phase-forming elements selected from the group consisting of Ru, Al, Mn, Rh Co, Zr, Fe, Ir, Os and Ni.

19. A method of producing a sintered target of an intermetallic compound being substantially B2-ordered lattice structure according to claim 12, wherein the powder of said intermetallic compound being substantially B2-ordered lattice structure is pulverized into particles.

20. A method of producing a sintered target of an intermetallic compound being substantially B2-ordered lattice structure according to claim 19, wherein the particles have an average size of 10 to 200 μm.

* * * * *